(12) United States Patent
Yang

(10) Patent No.: US 9,108,878 B2
(45) Date of Patent: Aug. 18, 2015

(54) PLATE GLASS AND MANUFACTURING PROCESS THEREOF

(76) Inventor: Dening Yang, Shenzhen (CN)

( * ) Notice: Subject to any disclaimer, the term of this patent is extended or adjusted under 35 U.S.C. 154(b) by 244 days.

(21) Appl. No.: 13/985,116

(22) PCT Filed: Mar. 15, 2011

(86) PCT No.: PCT/CN2011/000409
§ 371 (c)(1),
(2), (4) Date: Aug. 13, 2013

(87) PCT Pub. No.: WO2011/113302
PCT Pub. Date: Sep. 22, 2011

(65) Prior Publication Data
US 2013/0321751 A1    Dec. 5, 2013

(30) Foreign Application Priority Data

| | | | |
|---|---|---|---|
| Mar. 18, 2010 | (CN) | .......................... | 2010 1 0126584 |
| Apr. 30, 2010 | (CN) | .......................... | 2010 1 0160301 |
| Oct. 15, 2010 | (CN) | .......................... | 2010 1 0507872 |

(51) Int. Cl.

| | |
|---|---|
| *C03C 3/087* | (2006.01) |
| *C03C 3/04* | (2006.01) |
| *C03C 3/064* | (2006.01) |
| *C03C 3/118* | (2006.01) |
| *C03C 4/00* | (2006.01) |
| *G02F 1/1335* | (2006.01) |
| *H01L 31/0216* | (2014.01) |
| *H01L 31/0392* | (2006.01) |
| *H01L 31/048* | (2014.01) |

(52) U.S. Cl.
CPC . *C03C 3/04* (2013.01); *C03C 3/064* (2013.01); *C03C 3/118* (2013.01); *C03C 4/0092* (2013.01); *G02F 1/133514* (2013.01); *H01L 31/02168* (2013.01); *H01L 31/0392* (2013.01); *H01L 31/048* (2013.01); *Y02E 10/50* (2013.01)

(58) Field of Classification Search
CPC ........ C03C 3/083; C03C 3/093; C03C 3/085; C03C 3/087; C03C 3/078
USPC .......................................... 501/68, 69, 70, 72
See application file for complete search history.

(56) References Cited

U.S. PATENT DOCUMENTS

| | | | |
|---|---|---|---|
| 3,929,497 A | 12/1975 | Clark-Monks | |
| 6,949,485 B2 * | 9/2005 | Nakashima et al. | ............ 501/69 |
| 7,482,294 B2 * | 1/2009 | Landa et al. | .................... 501/70 |
| 7,892,999 B2 * | 2/2011 | Nagai et al. | .................... 501/70 |

(Continued)

FOREIGN PATENT DOCUMENTS

| | | |
|---|---|---|
| CN | 1722347 A | 1/2006 |
| JP | 2009091244 A | 4/2009 |
| JP | 2009167089 A | 7/2009 |

OTHER PUBLICATIONS

International Search Report for PCT/CN2011/000409.

*Primary Examiner* — Noah Wiese

(57) ABSTRACT

Provided is the plate glass having high annealing temperature, high strength, excellent flatness and low viscosity, and manufacturing process thereof, which can be used for display and photovoltaic solar device. The plate glass contains (in mass %) boron oxide 0-3.9%, sodium oxide 0.01-14%, iron oxide 0.01-5%, fluorine oxide 0%, magnesia 7-22.2%, alumina 0.01-39%, wherein the content of silica is 1.9-4.1 times that of calcium oxide, the content of calcium oxide is 1.0-1.8 times that of magnesia.

12 Claims, 2 Drawing Sheets

(56) References Cited

U.S. PATENT DOCUMENTS

| | | | |
|---|---|---|---|
| 8,349,455 B2 * | 1/2013 | Kondo et al. | 428/410 |
| 2002/0010066 A1 * | 1/2002 | Nakashima et al. | 501/69 |
| 2003/0083188 A1 * | 5/2003 | Seto et al. | 501/71 |
| 2009/0176038 A1 | 7/2009 | Komori et al. | |

* cited by examiner

PLATE GLASS AND MANUFACTURING PROCESS THEREOF

CROSS REFERENCE TO RELATED APPLICATION

This application claims priority to Patent Cooperation Treaty application number PCT/CN2011/000409, filed Mar. 15, 2011, which is hereby incorporated by reference as if fully set forth in its entirety.

SPECIFICATION

Branch of Technology

The present invention relates to preset indispensable compositions of $Na_2O$, $Fe_2O_3$, $Al_2O_3$, $SiO_2$, CaO, MgO or $TiO_2$ and BaO in a special scope, as well as technical solutions for the compositions whose special ratios are preset among $SiO_2$, CaO and MgO, which overcomes the technical prejudice that sodium or boron composition is necessary to form the fluxing composition; the key lies in the using of the technical solution invented from ratio of silicon, calcium and magnesium elements, and the technical solution invented with sodium or boron element omitted, producing expected new eutectoid with high annealing point and fluxing function or high $Al_2O_3$ content as well as the strength increased by 1-3 times; on the premise of energy saving, no boron poison gas emission and high quality control, the investment production efficiency is increased by 10-30 times, and new product properties as well as new purpose and function are brought about; a flat glass which features high annealing point, environmental protection, energy saving, emission reduction, high strength, high evenness and low viscosity and its preparation method, a display that uses the said glass, the substrate glass and outer cover glass of a photovoltaic solar device are formed.

The subject invention is to reveal and provide an invention of changes in the ratio of silicon, calcium, and magnesium; comparing all the elements of the prior art for flat glass which features high annealing point, environmental protection, energy saving, emission reduction, high strength, high evenness and low viscosity, selection of the ratio of silicon, calcium and magnesium end values, omission of conventional fluxing ingredients such as sodium and boron, and selection of the range of other ingredients, each new purpose of flat glass which features high annealing point, environmental protection, energy saving, emission reduction, high strength, high evenness and low viscosity reveals the new properties of the products and produces a variety of unexpected technical effects.

BACKGROUND ART

The flat glass which features high annealing point, environmental protection, energy saving, emission reduction, high strength, high evenness and low viscosity for modern flat buildings and industrial purpose manufactured by adopting float process, horizontal drawing process, Glaverbel process, calendaring process or overflow process, such as (1) door, window and wall glass for buildings, (2) glass for automobile and ship, (3) glass for high-speed rail, (4) LCD glass, (5) PDP glass, (6) TFT glass and high-strength panel glass for smartphone and iPad and (7) craft glass, has significant defects in the formula of production process as well as a technical prejudice; it adopts $Na_2O$ or $B_2O_3$ to melt $SiO_2$; in the process of conventional melting technology, there is a technical prejudice for eutectic compositions; it is limited to the inherent compositions of silicon, calcium and aluminum; the viscosity is still not high even though about 13% $Na_2O$ or 8-15% $B_2O_3$ is added; a great deal of $Al_2O_3$ is not suggested to be added to enhance the product strength and annealing point, because by this way will it make the products in the prior art fail to control the product quality and output at higher viscosity temperature; besides, its energy-saving effect and strength are rather poor; particularly, boron volatilizes greatly, which makes the production of all existing alkali-free boron glass cause serious environmental problems.

(1) The prior art for alkali-free boron glass is represented alkali-free LCD glass with patent No. US2002/0011080A; in the technical solution for compositions, its patent material proposes that the content of $SiO_2$ is up to 40-70%; in this kind of boron glass and embodiment, silicon occupies between 60-70% while the content of $B_2O_3$ is 5-20%; in actual use, the content of $B_2O_3$ in the product is up to 8%-15%, which aims to replace $Na_2O$ by $B_2O_3$ and achieve the purpose of fluxing; if the boron content is over 8%, 2-3 times of raw materials must be added; if the boron content is 10%, the raw material of 25-30% $B_2O_3$ content must be added (because most of them will become toxic gases and volatilize at a high temperature); its first technical defect lies in that its silicon content is too high, and the silicon is not easily melted; its second technical defect lies in that it will cause serious environmental damage; its third technical defect lies in that the molten pool will be severely corroded in actual production when the boron content is up to 5-20%; (therefore, all TFT LCD will be conducted with cold repair when high-boron glass molten pool is used only in one year; this will cause serious problems such as work efficiency and cost; the boron content is too high particularly when boron glass for flat LCD is manufactured; with the same content of $Al_2O_3$, it will lower the strength by one time; all existing LCD glass can only be manufactured by overflow due to its high boron content; its output is only 6-10 tons/day, which is equal to 5% or less output by float process (e.g.: minimally 150 tons/day); moreover, there is only one overflow production line with 6-10 tons/day; its equipment cost is 2-3 times that of the float line with 150 tons/day; therefore, it has become an industrial difficulty that is expected to be solved as to how to reduce the cost and improve the efficiency in the production of liquid crystal glass, conduct cold repair every 10 years like the common float glasswork and achieve viscosity reduction and energy saving.

(2) The existing soda-lime flat glass which features high annealing point, environmental protection, energy saving, emission reduction, high strength, high evenness and low viscosity includes [1] door, window and wall glass for buildings, [2] glass for automobile and ship, [3] glass for high-speed rail, [4] PDP glass and [5] craft glass; due to limited acknowledgement for its melt compositions, the viscosity temperature is higher than that of the present invention (150° C.-200° C.) in the process of melting and bubble discharge and homogenization; the energy is greatly consumed during production; every kilogram of the melt consumes 1,500 kilocalorie or higher.

(3) In the application of glass for automobile and high-speed rail, the existing industrial glass products do not have too high flexural strength and impact resistance; if the strength of automobile glass is poor, its safety is not guaranteed well; the ship glass is usually destroyed by sea waves; in particular, there is still a big gap in the requirements of impact resistance of automobile glass.

(4) As the flexural strength of existing industrial glass products is low (normally about or less than 50 MPa), and its impact resistance is much poorer; therefore, the glass in the front of airplane and in the left and right windows needs to be thickened; this will increase the weight and affect the dead weight of airplane and sight sharpness.

(5) In architectural application, its use scope is also greatly limited due to the low annealing point and the limit of strength performance of existing glass product; it is necessary to make it light, thin, high-strength and energy-saving.

(6) In the prior art, fireproof glass, hot plate glass, oven glass, microwave oven glass, panel glass for kitchen or dining table and existing soda-lime glass do not have such excellent linear characteristics with even ascending and descending in terms of expansion rate; its viscoelasticity changes a lot; cracking happens easily; therefore, it has some defects in this application.

(7) In addition, there is "crystallized glass having natural-marble-like surface patterns and method of producing the same" with a publication number CN1053047A; its process rather than the product compositions has determined its inevitable product defects.

1. Its process is stated as: collect the small frit in molding case, have . . . crystal entered from the glass surface into the internal part; the frits are melted and mixed; control the frit size . . . , obtain the appearances of marble and granite patterns; in this document, a lot of statements are about crystallization process, so it can be seen that it adopts a neoceramic glass process with color patterns for granule viscous-melt crystallization.

Its color patterns and non-transparency is obviously not determined by material compositions; the product's crystal, colors and patterns are determined by adding every glass granule from its surface to the internal part with the process method stated in the application document; therefore, every granule is filled with crystals from outside to inside; it is not transparent, so it is impossible to make such a product which has good visible light transmittance of 65%-95%; theses defects need to be overcome.

SUMMARY

In view of the above prior art defects and shortcomings, the inventor makes positive research and innovation to overcome the prior art shortcomings and defects based on the practical experience and expertise for years in design and manufacturing of this kind of product; after solving the complex problems in production process, a novel technical solution is proposed: preset and indispensable compositions with practical vale and in a special scope such as $Al_2O_3$, $Na_2O$, $Fe_2O_3$, $SiO_2$, CaO, MgO or $TiO_2$ and BaO manufactured by float process, horizontal drawing process, overflow process or calendaring process and technical solutions for the compositions whose special ratios are preset among $SiO_2$, CaO and MgO; it has overcome the technical prejudice of all conventional fluxing compositions and sodium or boron composition that is used to form the fluxing composition; it can produce unexpected flat glass with high annealing point and fluxing function or eutectic function as well as the strength increased by 1.3 times; it can also produce a technical effect in environmental protection, energy-saving and emission reduction.

The first embodiment of the present invention provides a flat glass, characterized in that: the said glass contains $SiO_2$, CaO, MgO, $Al_2O_3$, $Fe_2O_3$ and $Na_2O$, Calculated as per weight percentage, the said flat glass contains $B_2O_3$ 0-3.9%, $Na_2O$ 0.01-14%, $Fe_2O_3$ 0.01-5%, $F_2O$ 0-2.8%, MgO 8.1-22.2% and $Al_2O_3$ 0.01-39%, wherein the content of $SiO_2$ is 1.9-4.1 times that of CaO, and the content of CaO is 1.2-1.6 times that of MgO; the lower limit of annealing temperature (endothermic peak threshold temperature) of the said flat glass goes between 550° C.-710° C.; the thickness difference of the said flat glass is less than 0.3 mm; the water absorption of the said flat glass goes between 0-0.3%; the flexural strength of the said flat glass is up to 50-180 Mpa.

According to the flat glass in the first embodiment of the present invention, wherein, (1) Calculated as per weight percentage, in its product contents: ① MgO is 7-20%; ② the content of CaO is 1.0-1.8 time(s) that of MgO; ③ $SiO_2$ is 2.6-5.6 times that of MgO; ④ $SiO_2$ is 2.2-3.8 times that of CaO; ⑤ $Al_2O_3$ is 0.1-30%; ⑥ $Na_2O$ is 0-18%; ⑦ BaO is 0-5%; (2) strain point temperature of its product goes between 560° C.-720° C.; (3) the water absorption of its product goes between 0-0.001%; (4) Calculated as per weight percentage, the total content of MgO, CaO and $SiO_2$ in its product is 51%-100%.

According to the flat glass in the first embodiment of the present invention, wherein, calculated as per weight percentage, in its product: the content of CaO is 1.15-1.8 times that of MgO.

According to the flat glass in the first embodiment of the present invention, wherein, calculated as per weight percentage, the content of CaO is 1.0-1.6 time(s) that of MgO, preferentially 1.2-1.5 times.

According to the flat glass in the first embodiment of the present invention, wherein, the undulating range of the waviness of the said glass at 20 ram is 0-0.03 mm.

According to the flat glass in the first embodiment of the present invention, wherein, calculated as per weight percentage, the content of $Na_2O$ is 0.01-0.99%.

According to the flat glass in the first embodiment of the present invention, wherein, calculated as per weight percentage, the content of $Na_2O$ is 0.01-2%.

According to the flat glass in the first embodiment of the present invention, wherein, calculated as per weight percentage, the content of $Na_2O$ is 2-8%.

According to the flat glass in the first embodiment of the present invention, wherein, calculated as per weight percentage, the content of $Na_2O$ is 2-14%.

According to the flat glass in the first embodiment of the present invention, wherein, calculated as per weight percentage, the content of $Al_2O_3$ is 10-19%.

According to the said flat glass in the first embodiment of the present invention, wherein, calculated as per weight percentage, the content of $Al_2O_3$ is 0.1-3%.

According to the said flat glass in the first embodiment of the present invention, wherein, calculated as per weight percentage, the content of $Al_2O_3$ is 3.1-19%.

According to the flat glass in the first embodiment of the present invention, wherein, calculated as per weight percentage, the thickness of the said glass is 0.3-1.8 mm.

According to the flat glass in the first embodiment of the present invention, wherein, the thickness of the said glass is 1.8 mm-5 mm.

According to the flat glass in the first embodiment of the present invention, wherein, the thickness of the said glass is 5-20 mm.

The second embodiment of the present invention provides a preparation method to prepare the above flat glass, characterized in that: Step 1: All preset and indispensable compositions in a special scope such as $Na_2O$, $Fe_2O_3$, $Al_2O_3$, $SiO_2$, CaO, MgO or $TiO_2$ and BaO and raw materials whose special ratios are preset among $SiO_2$, CaO and MgO are required by any of the said glass formula and configuration in the first embodiment; after being mixed and stirred, they are melted under the melting temperature for each glass formula to form the liquid glass with preset viscosity; then, they are homogenized and clarified and discharge bubbles to form flowing molten mass; Step 2: The glass is molded by adopting float process, horizontal drawing process, Glaverbel process, calendaring process or overflow process.

According to the method of the second embodiment of the present invention, wherein, the said step 1 includes: Place the prepared raw materials into the corresponding containers to make them pass through the conveyor lines of raw materials; after being measured, they are put into the mixing apparatus according to the proportion; after being stirred and mixed, they are put into the bulk material pipe or feed bin; put the formulated raw materials into molten pool to have them melted under the melting temperature of the glass and form the liquid glass with preset viscosity; then, they are homogenized and clarified and discharge bubbles to form flowing molten mass; float process used in step 2: Tin kiln is prepared in advance in this process; after the process of step 1, the flowing molten mass at the tail of molten pool flows into the tin kiln for such processes as smoothening, polishing and thinness drawing; then, it is drawn by edge-pulling machine according to the direction specified by the process and pulled by the dragger; it is pulled out of tin trough, and then it is cooled and annealed After being cooled and cut, the said glass is manufactured.

According to the method of the second embodiment of the present invention, wherein, calculated as per weight percentage, the content of $Al_2O_3$ in the said glass is 30%; when the viscosity is $10^{0.5}$ Pa·s, the temperature of the said glass is 1,480° C.-1,640° C.; when the viscosity is $10^1$ Pa·s, the temperature of the said glass is 1,410° C.-1,600° C.; when the viscosity is $10^2$ Pa·s, the temperature of the said glass is 1,180° C.-1,340° C.; when the viscosity is $10^3$ Pa·s, the temperature of the said glass is 1,040° C.-1,220° C.; the thickness difference of the said glass is less than 0.3 mm; the visible light transmittance of the said glass goes between 40%-95%; the water absorption of the said glass goes between 0-0.3%; the lower limit of annealing temperature (endothermic peak threshold temperature) of the said glass goes between 550° C.-710° C.; the flexural strength of the said glass is 50-180 MPa; the difference of thermal expansion coefficient of the said glass is 1.0-3.0 ppm between 150° C.-300° C.; the difference of thermal expansion coefficient of the said glass is 1.0-2.8 ppm between 550° C.-600° C.

The third embodiment of the present invention provides a LCD including an array substrate which includes a base and a pixel structure of the said base that is a glass plate manufactured with the flat glass as set forth in any of the first embodiment, a color filter substrate which includes a base and a color filter layer of the said base that is a glass plate manufactured with the flat glass as set forth in any of the first embodiment, a liquid crystal layer that is clamped between the said array substrate and the said base of color filter layer and backlight system.

The fourth embodiment of the present invention provides a photovoltaic solar device, including solar battery, glass substrate or outer cover plate manufactured with the flat glass as set forth in any of the above embodiments.

Figure 1:
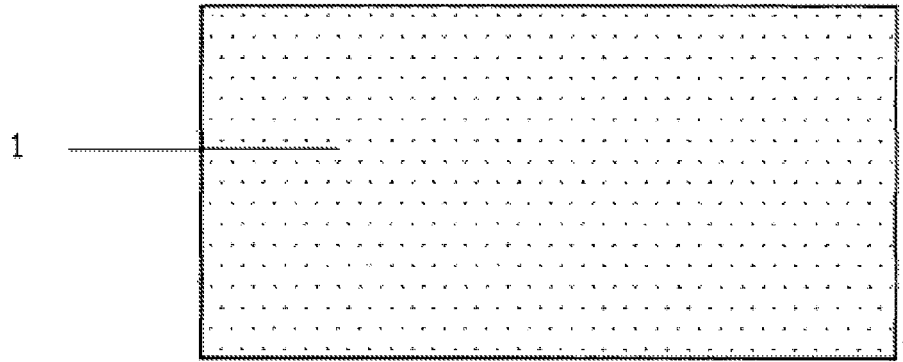
FIG. 1 is a plan diagram of a flat glass product.

DESCRIPTION OF FIGURE MARKS 1. flat glass
2. Inlet of feed bin
3. Feed bin
4. Present prepared mixing raw material
5. Raw materials entering the mouth of molten pool kiln of molten pool
6. Molten pool kiln
7. Diversion trough
8. Tin trough
9. Transitional roller
10 Annealing kiln
11. Cutting and sub-packing platform
12. Float production line matrix

EMBODIMENTS

A detailed description for the embodiments of the present invention is given as follows; (Unless otherwise specified in the specification, the contents of all compositions of the glass are calculated as per weight percentage).

The First Embodiment

The first embodiment of the present invention provides a flat glass which contains $SiO_2$, CaO, MgO, $Al_2O_3$, $Fe_2O_3$ and $Na_2O$; calculated as per weight percentage, the said flat glass contains $B_2O_3$ 0-3.9%, $Na_2O$ 0.01-14%, $Fe_2O_3$ 0.01-5%, $F_2O$ 0-2.8%, MgO 8.1-22.2% and $Al_2O_3$ 0.01-39%, wherein the content of $SiO_2$ is 1.9-4.1 times that of CaO, and the content of CaO is 1.2-1.6 times that of MgO; the lower limit of annealing temperature (endothermic peak threshold temperature) of the said flat glass goes between 550° C.-710° C.; the thickness difference of the said flat glass is less than 0.3 mm; the water absorption of the said flat glass goes between 0-0.3%; the flexural strength of the said flat glass is up to 50-180 Mpa.

The prior art of the flat glass such as soda-lime glass, PDP glass and LCD alkali-free boron glass have 3-5or 4-5 differences compared with the technical elements of the technical solutions of the present invention. (Refer to Table 1, 2 and 3)

Viscosity Performance

The viscosity of the embodiments of the present invention is measured by US THAT high-temperature rotary viscosimeter.

Seen from the embodiments in Table 1, 2 and 3 and compared with several key viscosity data (in case of 28% $Al_2O_3$):

(1) Melting temperature: According to the embodiment of the present invention, the temperature of a flat glass is 1,540° C.-1,620° C. when the viscosity is $10^{0.5}$ Pa·s; the temperature of a flat glass is 1,450° C.-1,520° C. when the viscosity is $10^1$ Pa·s.

In an alkali-free boron glass for LCD whose application content and the prior art is set forth in PDP and TFT LCD panel glass enterprise's application number 2008801044692 (publication number CN101784494A) "Glass plate and its method of producing the same and the method of producing TFT panel", its melting temperature at $10^5$ Pa·s and $10^1$ Pa·s is much higher than 1,650° C.-1,700° C.; therefore, its US viscosity cannot be measured by THAT high-temperature rotary viscosimeter; in particular, the melting temperature of the conventional soda-lime glass (containing only 1% $Al_2O_3$) can be measured as 1,580° C. at $10^{1.5}$ Pa·s; as is stated in P14 of its specification, the relatively proper temperature is 1,690° C. at $10^2$ Pa·s and the more proper temperature is 1,670° C.; these are all the basic values for the viscosity of the LCD glass; its melting temperature is higher than the temperature in the present invention at $10^{0.5}$ Pa·s or $10^1$ Pa·s, and it is the temperature at $10^2$ Pa·s for clarified and discharges bubbles at a difference of several hundred Celsius degrees; the temperature for each embodiment is 1,230° C.-1,300° C. when the content of $Al_2O_3$ in the present invention is within 28%; the temperature of the above soda-lime glass with low-level prior art goes between 1,380° C.-1,400° C., and such temperature for alkali-free high-boron glass cannot be measured by a tester (the tested temperature is higher than 1,600° C.); compared with the above patent, the preferred temperature for PDP glass is 1,690-1,670° C.

From the temperature under the forming viscosity $10^3$ Pa·s, the temperature of each embodiment is 1,090° C.-1,160° C. when the content of $Al_2O_3$ in the present invention is within 28%; the temperature of the existing soda-lime glass is 1,210° C.-1,250° C., and the temperature of alkali-free high-boron glass and PDP glass is up to 1,380° C.-1,420° C. Since the viscosity performance of the present invention is much better, the insiders all know that compared with the production of prior art, the flat glass with fewer bubble defects, fewer slag points, better waviness, better quality and higher rate of finished product can be available, and display glass with good quality and less thickness such as 0.5 mm, 0.3 mm and 0.2 mm can be manufactured.

Strength Performance

In the present invention, the content of $Al_2O_3$ can be up to 19-28%, and the strength can be about 140-160 MPa or 180 MPa which is much higher that 2-3 times of strength of the flat glass made the prior art; the viscosity temperature is 150° C.-250° C. lower than that the prior art when the content of $Al_2O_3$ is only 1-25%; therefore, if the viscosity of alkali-free high-boron glass is formed by the technical solution of the present invention, then there will be much room for melting viscosity and strength when the content of $Al_2O_3$ is raised to be 29-39%; the flexural strength of the glass in the embodiment f the present specification and invention is cut into pieces with a dimension of 50 mm×50 mm×5 mm and measured in accordance with GB/T3810.4-2006.

$B_2O_3$ in the alkali-free high-boron glass made the prior art volatilizes, which will result in uneven compositions, damage the net structure related to $Al_2O_3$ and thus greatly impact the due strength.

This is the important reason why the strength of the alkali-free high-boron glass is relatively poor even though it contains 7-15% $Al_2O_3$.

The above is also the advantage for strength improvement without boron in the technical solution of the present invention.

The linear characteristics of expansion coefficient of the present invention are outstanding, and few changes are witnessed at different ranges of temperature.

The expansion coefficient of the glass as set forth in the embodiment of the present invention is determined in accordance with GB/T7320.1-2000.

(1) The conventional technical prejudice is that $Al_2O_3$ is added to enhance the strain point temperature (the strain point temperature is the lower limit of the annealing temperature for the glass when it is formed.); the purpose of having the strain point reached 550° C.-600° C., 600° C.-650° C. or 650° C. above lies in that no more deformation or cracks are found when it is under relatively high temperature, the product is heated or cooled radically; however, the technical solution of the present invention has better linear characteristics of expansion coefficient and produces few abrupt changes over glass viscoelasticity; the difference of thermal expansion coefficient of the said glass is 1.0-3.0 ppm between 150° C.-300° C.; the difference of alkali-free glass is 1-3.0 ppm between 600° C.-650° C.; in display, it is 5-16 times as much as 16 ppm, a difference value of thermal expansion coefficient at 550° C.-600° C. for plasma PDP glass or LCD TFT glass as well as 7-20 times as much as 20 ppm, a difference value of thermal expansion coefficient at 550° C.-600° C. for LCD soda-lime glass.

This also provides a wide range of process selections as to whether $Al_2O_3$ is added or not for fireproof glass, glass for cooking utensils, glass for microwave oven and stoves, LCD glass, PDP glass and TFT glass etc; when it is applied under a use environment related to the process with ascending or descending temperature changes, industry, daily use and building, it will have great advantages such as little deformation, good stability, no abrupt changes, no cracks and radical reduction of glass viscoelasticity with ascending or descending temperature changes.

Compared with the advantages of TFT-LCD glass substrate: The present invention can control the difference (1-3.0 ppm) of expansion coefficient of sintering at ascending temperature (such as 150° C.-300° C., 550° C.-600° C. or 600° C.-650° C.) in the key sintering areas with descending temperature changes, therefore, it has actually been developed into a new functional material; then, it can be manufactured into LCD which has more than ten BPPs higher definition than all LCDs nowadays and takes alkali-free glass as a substrate, can creatively enhance a higher level and be understood by the electronics insiders, makes it a core technology and creates the latest and most advanced level in the world; it can also manufacture thinner (such as 0.2-0 5 mm thickness) and lighter LCD products which have greater sizes and high BPPs; liquid crystal mobile phone, TV, handheld TV, laptop, flat-pane PC and flat-panel TV will have higher definitions (BPPs) and resolutions, and their new technical quality will be available as well.

Advantages of Energy Saving and Emission Reduction

Since its melting viscosity temperature is lower than 200° C.-300° C. for the prior art and the energy consumption is mainly in the high-temperature area, it can save 30-40% energy and reduce the emission of $CO_2$ by 30-40%.

It can save equipment cost, cold repair cost and unnecessary cost of the prior art and process.

Since the melting temperature is greatly reduced and the erosion to refractory materials is greatly reduced, which will significantly prolongs the service life of smelter and greatly reduce the cold repair time and expense that severely affect the production output; for example, alkali-free boron glass, especially TFT liquid crystal glass, requires cold repair every 8-10 months, which results in production stopping at least for 2-3 months; moreover, the refractory materials used are high-zirconia materials, and the material cost will be 3-4 times higher than before; in addition, a large number of materials are replaced every year; the service life of the molten pool for manufacturing the glass in the embodiment of the present invention is longer than the alkali-free glass, and the viscosity of the glass in the embodiment of the present invention is lower than float soda-lime glass; moreover, it can completely contain no boron and be used at least for 10 years before the cold repair is conducted.

Therefore, various patent literatures for PDP plasma glass or TFT LCD glass and the real implementation process propose the processes to add oxygen blowing, bubble discharge and shallow pool equipment, which have high cost and low efficiency, and TFT glass uses expensive platinum as the bubble discharge channel, greatly increasing the temperature; for a small stove of 6-7 tons daily production, the platinum channel cost is 0.3-0.5 billion yuan; to reach 150 tons daily output, the platinum channels amount to nearly 10 billion yuan, which is high in cost and low in efficiency.

Water Absorption

The water absorption of the glass as set forth in the embodiment of the present invention is determined in accordance with GB/T3810.3-2006.

The water absorption of its product as set forth in the glass embodiment of the present invention goes between 0-0.3%.

In addition, LCD, PDP and TFT glass as set forth in the glass embodiment of the present invention has good transparency and waterproofness.

The thickness difference (is measured in accordance with GB/T1216)

The thickness difference of the said glass as set forth in the glass embodiment of the present invention is less than 0.3 mm.

In addition, the glass can be manufactured to be transparent, conforming to the transparency characteristics in the related field; the visible light transmittance of the said glass goes between 40%-95% (and is measured in accordance with GB/T2680); To detail the technical solutions of the embodiment of the present invention, Table 1 lists the technical solutions and the corresponding performances for a flat glass sample as set forth in the embodiment of the present invention.

TABLE 1

| | Sample 1 | Sample 2 | Sample 3 | Sample 4 | Sample 5 | Sample 6 | Sample 7 | Sample 8 | Sample 9 | Sample 10 | Sample 11 |
|---|---|---|---|---|---|---|---|---|---|---|---|
| $SiO_2$:CaO | About 1.9 | About 2.0 | About 4.1 | About 4.1 | About 2.5 | About 2.1 | About 2.3 | About 2.5 | About 2.9 | About 3.3 | About 3.6 |
| CaO:MgO | About 1.2 | About 1.6 | About 1.2 | About 1.6 | About 1.4 | About 1.4 | About 14.5 | About 1.4 | About 1.4 | About 1.3 | About 1.2 |
| MgO content (wt %) | 20.7 | 15.8 | 11.2 | 10.5 | 11.1 | 13.3 | 11.7 | 11.8 | 12 | 11.1 | 11.5 |
| CaO content (wt %) | 25.2 | 24.5 | 13.8 | 16.5 | 15.2 | 18.5 | 17 | 16.5 | 16.8 | 14.4 | 14 |
| $SiO_2$ content (wt %) | 48.4 | 50 | 56.1 | 67 | 38.2 | 39.2 | 39.3 | 41.2 | 48.7 | 47.6 | 50 |
| Total content of $SiO_2$, CaO and MgO (wt %) | 94.3 | 90.3 | 81.1 | 94 | 64.5 | 71 | 68 | 69.5 | 77.5 | 73.1 | 75.5 |
| $Fe_2O_3$ content (wt %) | 0.1 | 0.15 | 0.2 | 0.2 | 0.3 | 0.1 | 0.2 | 0.1 | 0.1 | 1.3 | 1.2 |
| $Al_2O_3$ (wt %) | 3.6 | 4 | 12.7 | 3.1 | 25 | 20 | 30 | 28 | 20 | 23 | 16 |
| $Na_2O$ content (wt %) | 1 | 5 | 5 | 1.9 | 2 | 2 | 0.5 | 1 | 1 | 1 | 5 |
| BaO content (wt %) | 0.8 | / | 0.8 | / | 5.7 | 4.9 | 0.5 | 0.4 | 0.4 | 1 | 1.3 |
| $B_2O_3$ content (wt %) | / | / | / | / | / | / | 0.5 | / | / | / | / |
| $TiO_2$ content (wt %) | 0.2 | 0.55 | 0.2 | 0.8 | 2.5 | 2 | 0.3 | 1 | 1 | 0.6 | 1 |
| Lower limit of annealing temperature (endothermic peak threshold temperature) (° C.) | About 600 above | About 590 above | About 590 above | About 590 above | About 630 above | About 630 above | About 650 above | About 650 above | About 630 above | About 630 above | About 590 above |
| Flexural strength (MPa) | About 60-80 | About 60-80 | About 80-100 | About 70-80 | About 145-155 | About 130-150 | About 160-180 | About 150-170 | About 135-150 | About 140-160 | About 90-110 |
| Thickness difference | <0.3 mm | <0.3 mm | <0.3 mm | <0.3 mm | <0.3 mm | <0.3 mm | <0.3 mm | <0.3 mm | <0.3 mm | <0.3 mm | <0.3 mm |
| Visible light transmittance | About 40-95% | About 40-95% | About 40-95% | About 40-95% | About 40-95% | About 40-95% | About 40-95% | About 40-95% | About 40-95% | Non-transparent | Non-transparent |
| Water absorption | 0-0.3% | 0-0.3% | 0-0.3% | 0-0.3% | 0-0.3% | 0-0.3% | 0-0.3% | 0-0.3% | 0-0.3% | 0-0.3% | 0-0.3% |
| Melting process temperature (° C.) at $10^{0.5}$ Pa · s | About 1,580 | About 1,600 | About 1,580 | About 1,590 | About 1,600 | About 1,560 | About 1,640* | About 1,620* | About 1,560 | About 1,580 | About 1,550 |

TABLE 1-continued

| | Sample 1 | Sample 2 | Sample 3 | Sample 4 | Sample 5 | Sample 6 | Sample 7 | Sample 8 | Sample 9 | Sample 10 | Sample 11 |
|---|---|---|---|---|---|---|---|---|---|---|---|
| Melting process temperature (° C.) at $10^2$ Pa·s | About 1,490 | About 1,510 | About 1,500 | About 1,510 | About 1,520 | About 1,530 | About 1,570 | About 1,560 | About 1,490 | About 1,510 | About 1,480 |
| Clarification, bubble discharge process temperature (° C.) at $10^3$ Pa·s | About 1,285 | About 1,280 | About 1,290 | About 1,290 | About 1,320 | About 1,300 | About 1,350 | About 1,340 | About 1,300 | About 1,305 | About 1,295 |
| Forming process temperature (° C.) at $10^3$ Pa·s | About 1,130 | About 1,120 | About 1,145 | About 1,130 | About 1,180 | About 1,160 | About 1,220 | About 1,200 | About 1,160 | About 1,170 | About 1,140 |
| Difference value of expansion coefficient at 150° C.-300° C. (about PPM) | About 1.6-2.8 | About 1.2-2.5 | About 1.6-2.7 | About 1.6-2.6 | About 1.4-2.7 | About 1.7-2.8 | About 1.6-2.4 | About 1.4-2.8 | About 1.2-2.5 | About 1.4-2.6 | About 1.6-2.7 |
| Difference value of expansion coefficient at 550° C.-600° C. (about PPM) | About 1.4-2.5 | About 1.3-2.6 | About 1.8-2.8 | About 1.6-2.5 | About 1.7-2.6 | About 1.8-2.3 | About 1.9-2.2 | About 1.4-2.4 | About 1.5-2.1 | About 1.8-2.3 | About 1.8-2.8 |
| Difference value of expansion coefficient at 600° C.-650° C. (about PPM) | / | / | / | / | / | / | About 1.5-2.4 | About 1.7-2.6 | About 1.6-2.8 | / | / |

Note:
Lower limit of annealing temperature (endothermic peak threshold temperature) is measured by thermal analyzer.
*It cannot be measured by calculated but not by high-temperature rotary viscosimeter

TABLE 2

(Prior Art)

| | Sample I soda-lime glass (It is a float line product in North China. The difference of all float soda-lime glass compositions is only between 1-2%.) | Sample II PDP glass (Glass and Enamel $4^{th}$ Issue, Volume 33, August 2005 and other literatures) | Sample III LCD boron glass CN101784494A, US2002/0011080A1 and other literatures and embodiments | Technical solution in "crystallized glass having natural-marble-like surface patterns and method of producing the same" with a publication number CN1053047A. |
|---|---|---|---|---|
| MgO (wt %) | About 5 | About 0-4 | 0.5 | 0.5-17 |
| CaO (wt %) | About 6 | About 3-3.5 | About 4.5 | 1-20 |
| $SiO_2$ (wt %) | About 74 | About 54-60 | About 59 | 45-75 |
| $Al_2O_3$ (wt %) | About 1 | About 6-11 | About 15 | 1-25 |
| $Na_2O$ (wt %) | About 13 | About 0-6 | / | 1-15 |
| $B_2O_3$ (wt %) | / | / | About 10.5 | 0-10 |
| BaO (wt %) | / | About 9 | About 6 | 0.1-18 |
| $K_2O$ (wt %) | About 1 | About 10 | / | / |

TABLE 2-continued (Prior Art)

| | Sample No. | | | |
|---|---|---|---|---|
| | Sample I soda-lime glass (It is a float line product in North China. The difference of all float soda-lime glass compositions is only between 1-2%.) | Sample II PDP glass (Glass and Enamel 4$^{th}$ Issue, Volume 33, August 2005 and other literatures) | Sample III LCD boron glass CN101784494A, US2002/0011080A1 and other literatures and embodiments | Technical solution in "crystallized glass having natural-marble-like surface patterns and method of producing the same" with a publication number CN1053047A. |
| Fe$_2$O$_3$ (wt %) | About 0.1 | 0 | 0 | 0 |
| TiO$_2$ (wt %) | 0 | 0 | 0 | 0 |
| Melting process temperature (° C.) at 10$^{0.5}$ Pa · s | It cannot be measured by high-temperature rotary viscosimeter. | It cannot be measured by high-temperature rotary viscosimeter. | It cannot be measured by high-temperature rotary viscosimeter. | Due to a lot of crystals, it cannot be measured by high-temperature rotary viscosimeter. |
| Melting process temperature (° C.) at 10$^2$ Pa · s | It cannot be measured by high-temperature rotary viscosimeter. | It cannot be measured by high-temperature rotary viscosimeter. | It cannot be measured by high-temperature rotary viscosimeter. | Due to a lot of crystals, it cannot be measured by high-temperature rotary viscosimeter. |
| Clarification, bubble discharge process temperature (° C.) at 10$^3$ Pa · s | About 1,380-1,400 | About 1,600-1,650 | It cannot be measured by high-temperature rotary viscosimeter. | Due to a lot of crystals, it cannot be measured by high-temperature rotary viscosimeter. |
| Forming process temperature (° C.) at 10$^3$ Pa · s | About 1,210-1,250 | About 1,500-1,560 | About 1,480-1,580 | Due to a lot of crystals, it cannot be measured by high-temperature rotary viscosimeter. |
| Forming process temperature (° C.) at 10$^{3.7}$ Pa · s | About 1,065-1,100 | About 1,380-1,420 | About 1,350-1,400 | Due to a lot of crystals, it cannot be measured by high-temperature rotary viscosimeter. |
| Flexural strength (MPa) | About 45 | About 55 | About 50 | It is lower than 50. Due to a lot of crystals, its strength is poor. |
| Difference value of expansion coefficient of glass at 550° C.-600° C. (about PPM) | About 20 | About 15 | / | Due to a lot of crystals, it cannot be measured. |
| Difference value of expansion coefficient of glass at 600° C.-650° C. (about PPM) | / | / | About 10 | Due to a lot of crystals, it cannot be measured. |
| Lower limit of annealing temperature (endothermic peak threshold temperature) (° C.) | About 490 | About 580 | About 600-650 | / |
| Thickness difference | <0.3 mm | <0.3 mm | <0.3 mm | Up to 1.5 mm-2 mm |
| Visible light transmittance | 50-80% | 65%-95% | 65%-95% | It is lightproof due to being full of crystals and patterns. |
| Thickness difference | Within 0.3% | Within 0.3% | Within 0.3% | It is more than 0.5% due to a lot of bubbles among crystal granules. |

*It cannot be measured by calculated but not by high-temperature rotary viscosimeter.

Seen from Table 1:

In the samples of the prior art of the present invention as stated in the embodiment, the content of B$_2$O$_3$ is 0-3.9%, the content of Fe$_2$O$_3$ is 0.01-5%, the content of TiO$_2$ is 0.0003-4.95%, the content of BaO is 0.01-14%, the content of Na$_2$O is 0.01-8.8% and the content of MgO is 8.1-22.2%. SiO$_2$:CaO is 1.9-4.1 times that of CaO:MgO is 1.2-1.6 times that of MgO; firstly, the viscosity is better than the melting viscosity in the prior art at $10^{0.5}$ Pa·s and $10^1$ Pa·s; when the viscosity is $10^2$ Pa·s, bubble discharge, clarification and homogenized viscosity are better than the prior art for 150° C.-400° C. (See and compare Table 2 and Table 3); moreover, its coefficient of linear thermal expansion is within the differences among 150° C.-300° C., 550° C.-600° C. and 600° C.-650° C.; it is better than soda-lime glass, PDP glass and high-boron glass for alkali-free LCD.

In the preferential samples 6, 7, 8, 9 and, the content of CaO is 1.3-1.5 times that of MgO, the content of $SiO_2$ is 2.1-3.3 times that of CaO, and the content of $Al_2O_3$ is in a preferential scope of 19-30%; particularly, the technical effect indications such as the differences of viscosity and coefficient of linear expansion as well as temperature indicators are the best.

Samples 1, 2, 3, 4, 5 and 11 are included in the technical solutions of the present invention.; it can be seen that its viscosity, strength and expansion coefficient are better than TFT LCD boron glass made with the prior art, PDP plasma display glass and the flat glass made with the prior art.

Samples 1, 2, 3 and 4 are the embodiments in the technical solution of the present invention, falling into the scope of upper limit, lower limit, crossing upper and lower limits of the proportions of magnesium, calcium and silicon; samples 1 and 5 are the embodiments the upper and lower limits in which the total content of silicon, calcium and magnesium is 59.5-99.8%.

Seen from samples 1-9, the contents of ferrum, barium and titanium are within a certain scope, the visible light transmittance goes between 40%-95%, and they are applicable for the use of transparent glass; in samples 10 and 11, the content of ferrum goes between 1-1.3, and the contents of BaO and $TiO_2$ are relatively high; therefore, it will become non-transparent brown or claybank color so as to adapt to the innovation and high-quality wall whose strength, viscosity temperature and strain points etc, are much better that the flat glass made with the prior art; it is particularly applicable to the use of senior decorative flat glass in the non-transparent window wall of external wall and the furniture.

Table 2 lists some existing glass formulas and relevant performances; seen from Table 2, the contents of boron, ferrum and sodium of the four samples are different from the present invention, and the ratios between silicon and calcium, CaO and MgO are totally different from the present invention; the proportions between $SiO_2$ and CaO, CaO and MgO are much higher than the present invention; in the present invention, the content of CaO is 1.2-1.6 times that of MgO and the content of $SiO_2$ is 1.9-4.1 times that of CaO; the contents between $SiO_2$ and CaO as well as CaO and MgO in these products are totally different; seen from Table 2, silicon is always considered technically as the glass skeleton and the matrix that is melted or difficult to be melted; therefore, its viscosity and melting process temperature at $10^{0.5}$ Pa·s and $10^1$ Pa·s cannot be measured by the standard rotary viscosimeter (because the viscosity is too high); it can be seen that it is relatively or very difficult to overcome the energy consumption, slag points and stones and improve the production efficiency; the temperature during normal bubble discharge and homogenization and at $10^2$ Pa·s is 150° C.-300° C. higher than that of the samples in Table 1 for the present invention; it can be seen that bubble discharge and homogenization are difficult; the process of the present invention features energy saving and easy control; as for the forming process temperature at $10^3$ Pa·s, the present invention has a comparative advantage of easy technical control in terms of forming, product evenness and thickness; in product strength, the product in the present invention is 2-3 times as much as it; in coefficient of linear expansion, it has great advantages when thin film transistor is sintered on the glass, or when it comes to the difference changes at several important temperature areas for linear characteristics of fire and explosion protection and viscoelasticity values.

Table 3 is totally different from the compared examples in the technical solution of the present invention; first, it is a product without containing boron, titanium and sodium; in particular, the magnesium contents in compared examples 1 and 2 do not go between 8.1-22.2% in the present invention; the proportion between silicon and calcium or calcium and magnesium is also higher than that of the samples in the technical solution of the present invention; compared examples 3, 4, 5 and 6 are the examples of representative LCD glass US2002/0011080A1; like all the existing patent literatures of liquid crystal glass and products, their boron content is more than 5% (The boron contents of samples 1-11 in Table 1 for the present invention go between 0.01-3.9%); they do not contain ferrum (The ferrum content of sample 11 in Table 1 for the present invention is 0.01-5%) they do not contain titanium; (The ferrum contents of samples 1-11 in Table 1 for the present invention go between 0.0001-4.9%); they do not contain sodium (The sodium contents of samples 1-11 in Table 1 for the present invention go between 0.01-8.8%) Silicon is 12-60 times that of calcium; (It is 1.9-4.1 times in the present invention) Calcium is 0.25 times, 1.75 times or infinite times that of magnesium; (It is 1.2-1.6 times in the present invention); in technical effect, the melting viscosity temperature, clarification and bubble discharge viscosity temperature and forming process viscosity temperature for the six compared examples are higher than 150° C.-300° C.; it is 2-3 times difference in terms of the technical effect of flexural strength; (It is mainly attributed to too little $Al_2O_3$, or boron is added too much under the same percentage of $Al_2O_3$) if it is 5-15%, it will make the boron volatilize greatly in a technical manner, make the compositions uneven, result in loosening of material net structure and greatly affect the flexural strength; for example, when the content of $Al_2O_3$ in compared sample 1 is 16-20%; as it contains 8.5% boron, its strength is only 50-60 MPa; when the content of $Al_2O_3$ in the example of the present invention in Table 1 is about 20%, it can be up to 130-150 MPa.

TABLE 3

| | Sample No. | | | | | |
|---|---|---|---|---|---|---|
| | Compared example 1 | Compared example 2 | Compared example 3 | Compared example 4 | Compared example 5 | Compared example 6 |
| $SiO_2$:CaO | About 1.5 | About 5 | About 60 | About 12 | About 12 | About 16 |
| CaO:MgO | About 1.0 | About 1.8 | About 0.25 | Infinite times | Infinite times | About 1.75 |
| MgO content (wt %) | 28 | 7.2 | 4 | / | / | 2 |
| CaO content (wt %) | 28 | 13 | 1 | 5.4 | 3.5 | 3.5 |

TABLE 3-continued

| | Sample No. | | | | | |
|---|---|---|---|---|---|---|
| | Compared example 1 | Compared example 2 | Compared example 3 | Compared example 4 | Compared example 5 | Compared example 6 |
| $SiO_2$ (wt %) | 42 | 65 | 60 | 56.3 | 56.2 | 56 |
| Total contents of $SiO_2$, CaO and MgO (wt %) | 98 | 85.2 | 65 | 61.7 | 59.7 | 61.5 |
| $Al_2O_3$ (wt %) | 2 | 14.8 | 16 | 10.7 | 11 | 10.5 |
| $Na_2O$ (wt %) | / | / | 8.5 | 8.4 | 8.3 | 15 |
| BaO (wt %) | / | / | 6 | 13 | 13.2 | 5.5 |
| Melting process temperature (° C.) at $10^{0.5}$ Pa · s | * | * | * | * | * | * |
| Melting process temperature (° C.) at $10^2$ Pa · s | About 1,580 | About 1,520 | * | * | * | * |
| Clarification, bubble discharge process temperature (° C.) at $10^3$ Pa · s | About 1,480 | About 1,390 | * | * | * | * |
| Forming process temperature (° C.) at $10^3$ Pa · s | About 1,360 | About 1,340 | >1,350 | >1,350 | >1,350 | >1,350 |
| Water absorption | Within 0.3% | Within 0.3% | Within 0.3% | Within 0.3% | Within 0.3% | Within 0.3% |
| Flexural strength | About 50-60 | About 50-60 | About 50-60 | About 50-60 | About 50-60 | About 50-60 |
| Thickness difference | <0.3 mm | <0.3 mm | <0.3 mm | <0.3 mm | <0.3 mm | <0.3 mm |
| Visible light transmittance | About 40%-95% | About 40%-95% | About 40%-95% | About 40%-95% | About 40%-95% | About 40%-95% |

(* indicates that it cannot be measured by high-temperature rotary viscosimeter.)

It can be learned from the above description that the present invention can make the temperature under each viscosity reduce when the glass is melted, and thus glass performance, composition and energy saving can be combined very well; however, the present invention is not limited to the following examples, but it can be adjusted and changed according to the requirements based on the present invention.

Based on the above first embodiment, the limited is calculated according to the weight percentage; the content of $Al_2O_3$ is 0.1-19% based on the calculation of weight percentage.

The Third Embodiment

FIG. 1 a plan diagram of a flat glass and preparation process product as set forth in the embodiment of the present invention; it can be seen from the figure that mark 1 of the figure is a flat glass product.

Figure 2:
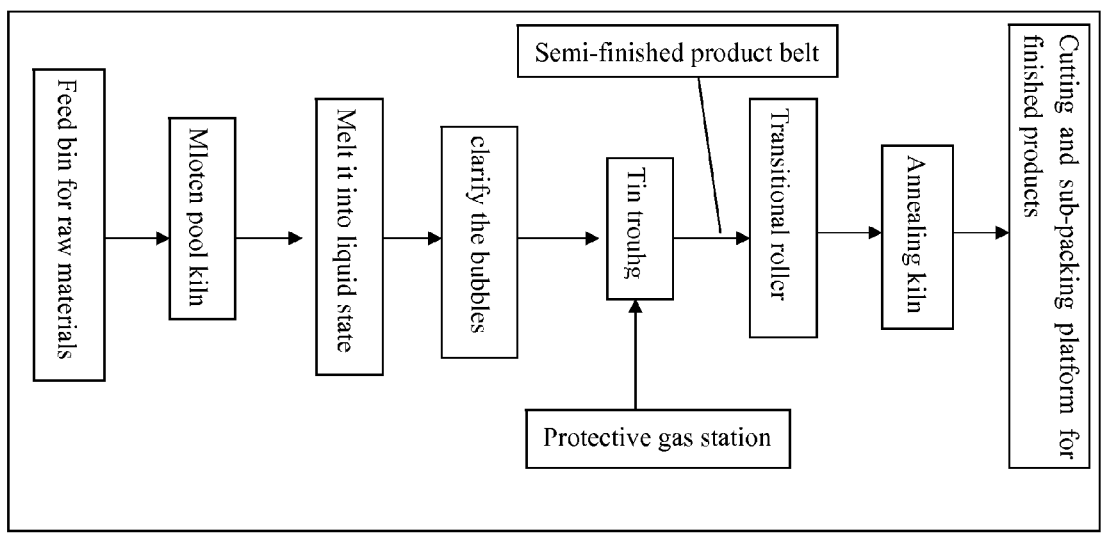
FIG. 2 is a flow diagram of a float process forming of preparation process of a flat glass.

FIG. 2 is a flow diagram of a float process forming of preparation process of a flat glass; it can be seen from the figure that its forming process flow is to put the preset prepared raw materials into the feed bin, convey the raw materials in feed bin to the molten pool kiln, melt them in molten at preset temperature and discharge the bubbles; and then the liquid molten mass enters the tin trough (gas protecting station for nitrogen and hydrogen nearby by the tin trough is set to supply the protecting gas to the tin trough); it is smoothened, drawn and pulled on the tin surface of tin trough to form polishing and flat semi-finished product belts; the glass products are obtained after the transitional roller enters the annealing kiln for temperature reduction and cooling; the finished products can be obtained after being cut and sub-packed as per the preset sizes on the cutting and sub-packing platform.

Figure 3:
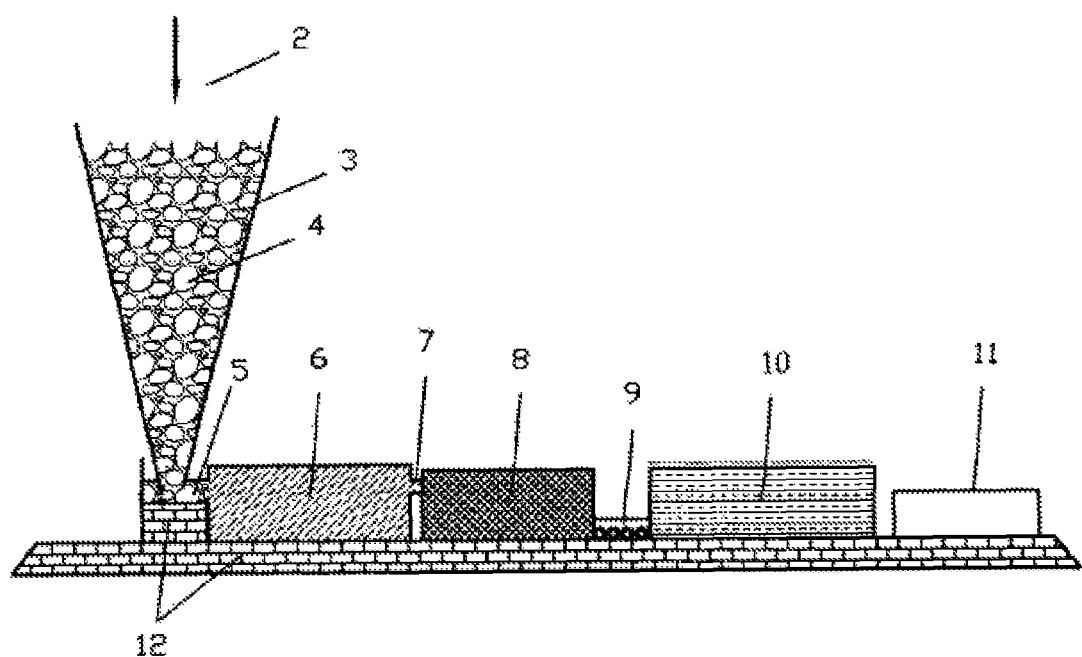
FIG. 3 is a side section diagram of a float process forming state of preparation process of a flat glass.

FIG. 3 is a side section diagram of a float process forming state of preparation process of a flat glass; it can be seen from the figure that mark 2 of the figure is inlet of feed bin, mark 3 of the figure is feed bin, mark 4 of the figure is preset prepared mixing raw material, mark 5 of the figure is raw materials entering molten pool kiln of molten pool (The preset prepared mixing raw materials as shown in mark 4 of the figure are conveyed to the molten pool of the molten pool kiln), mark 12 of the figure is float production line matrix, mark 6 of the figure is molten pool, mark 7 of the figure means that the liquid melting raw materials enter diversion trough of tin trough, mark 8 of the figure is tin trough under float process, mark 9 of the figure is semi-finished product belts formed in the tin trough enter the transitional roller of annealing kiln, mark 10 of the figure is annealing kiln and mark 11 of the figure is the cutting sub-packing platform that cuts and packs the formed products.

A further description on the preparation process and float forming process of a flat glass is given, and its manufacturing process comprises the following steps:

(1) First, prepare the raw materials; the raw material ratio is calculated according to the above first embodiment, its modifications and the compositions of a flat glass in the example.

(2) The prepared float processes shown in FIG. 3 include the float production lines such as raw material bin, molten pool kiln, tin kiln with tin liquid, edge-pulling machine, dragger, transitional roller, annealing kiln cooling system, cutting and sub-packing platform etc.

(3) Based on the production flow of float process shown in FIG. 3 and FIG. 2, deliver the preset and prepared mixing materials shown in mark 4 of the figure prepared in step (1) into the raw material bin shown in mark 3 of the figure with conveyor belt from the inlet of feed bin shown in mark 2 of FIG. 3, deliver the prepared mixing materials prepared in step (1) into the molten pool of molten pool kiln with preset high-temperature assistance shown in mark 6 of the figure through the mouth of molten pool kiln shown in mark 5 of the figure; gradually, liquid molten mass with good fluidity is formed at each melting temperature area corresponding to each glass formula; the bubbles of liquid raw materials are discharged gradually through high-temperature area; then, melting mass of mixing raw material with good fluidity is formed to enter the forming process.

(4) Based on the production flow of float process shown in FIG. 2 and FIG. 3, make the melting mass of mixing raw material with good fluidity in step (3) flow into the tin surface of tin trough (also called tin kiln) shown in mark 8 of the figure for float production line from the molten pool kiln shown in mark 6 of the figure to the nip of diversion trough shown in mark 7 of the figure; then, they are smoothened, drawn by the edge-pulling machine and pulled by the dragger, polished and smoothened on the tin liquid level; the semi-finished product belt is formed and comes out of the tin kiln through the transitional roller shown in mark 9 of the figure to be cooled by the annealing kiln by entering the temperature reduction and cooling system in roller bed shown in mark 10 of the figure; then, it enters the cutting and sub-packing platform shown in mark 11 of the figure for cutting and sub-packing to obtain the flat glass product which features high annealing point, environmental protection, energy saving, emission reduction, high strength, high evenness and low viscosity as set forth in the above first embodiment, its modifications and examples shown in FIG. 1.

Modification of the Third Embodiment

For the forming process of the glass as set forth in the embodiment of the present invention, any of the following processes can be adopted except the above float process: horizontal drawing process, Glaverbel process, calendaring process, overflow process, re-down-leading process, pressing forming and process forming For horizontal drawing process, the above glass can be manufactured with the flowing melting mass formed in the melting steps by stretching, forming, annealing, cooling and cutting with horizontal drawing characteristics.

For Glaverbel process, the above glass can be manufactured with the flowing melting mass formed in the melting steps by Glaverbel process through calendaring, forming, annealing, cooling and cutting.

For the calendaring process, the above glass can be manufactured with the flowing melting mass formed in the melting steps by calendaring, forming, annealing, cooling and cutting.

For overflow process, the above glass can be manufactured with the flowing melting mass formed in the melting steps by the overflow process through down-leading, forming, annealing, cooling and cutting.

For a flat glass made above as set forth in the embodiment of the present invention, one of the important aspects is that the present invention has the new technical solutions for the compositions used for fluxing; it can greatly reduce the melting temperature of the glass and thus makes this kind of glass particularly applicable to float process and overflow process; in normal float process and overflow process, the present field is always limited under the glass formula with high silicon content; when it requires high strength and the addition of $Al_2O_3$, the raw materials are melted by using every means and the extreme conditions; at least in the existing float process and overflow process, the glass formula in the embodiment of the present invention has not been used yet; the following details the applicable reasons for these three kinds of glass forming in a flat glass formula in the embodiment of the present invention.

In prior art, float process or overflow process is applicable to the glass with very high requirements on the plane; when it is used in the display product with 1.1 mm-0.7 mm or 0 5 mm thickness, the requirements on raw materials are high, and no stones or slag points are formed due to non-melting; therefore, it has high requirements on melting viscosity; otherwise, there will be significant defects which result in nonconforming products; then, it has high requirements on the product homogenization and the viscosity of bubble discharge; otherwise, the bubbles will not be discharged thoroughly, which is significantly seen on the glass and thus results in product nonconformity; in particular, it has high requirements on forming temperature viscosity, because a process of smoothening and leveling is available when it is float forming; if the viscosity is high, it will be too thick and the smoothening is slow; it will affect the quality; the thickness and unevenness of product surface during polishing and stretching processes will be greatly affected due to great thickness and unevenness during leveling and smoothening processes; the product surface has the wave block defects; for example, PDP glass requires secondary polishing of float product, because the viscosity of the glass is too high during forming and smoothening processes.

Therefore, the present invention overcomes the technical solution with conventional and technical prejudice; in float process, overflow process, calendaring process, Glaverbel process and horizontal drawing process, it has significant and essential technical progress in the viscosity for the three most important processes—melting, homogenization of bubble discharge, leveling and smoothening, especially the viscosity of polishing and stretching processes in float process.

To sum up, the glass in the present invention can reflect its superior technical solution especially in the production processes of all kinds of flat glass, and has overcome the technical prejudices in these fields.

Applications

Since the above flat glass as set forth in the embodiment of the present invention can break through the aforesaid three kinds of conventionally technical prejudices, it can be applied in (1) door, window and wall glass for buildings, (2) glass for automobile and ship, (3) glass for high-speed rail, (4) LCD glass, (5) PDP glass, (6) TFT glass and high-strength panel glass for smartphone and iPad and, (7) craft glass and reprocessed tempering product, (S) LCD and, (9) photovoltaic solar device.

The Fourth Embodiment

The fourth embodiment of the present invention has disclosed a LCD which includes: an array substrate which includes a base and a pixel structure of the said base that is a glass plate manufactured with the flat glass as set forth in the first embodiment, its modification and examples; the said base is a glass plate manufactured with the flat glass as set forth in any of Claims 1-5; A color filter substrate which includes a base and a color filter layer of the said base that is a glass plate manufactured with the flat glass as set forth in any of Claims 1-5, a liquid crystal layer that is clamped between the said array substrate and the said base of color filter layer and backlight system.

The Fifth Embodiment

Since the glass in the present invention can reduce the viscosity, it can be formed as thinner glass; if such thinned glass is used in the substrate or outer cover plate, it can improve the visible light transmittance and strengthen the absorption efficiency of solar battery; therefore, the present invention provides a photovoltaic solar device that includes solar battery, glass substrate or outer cover plate manufactured with the flat glass in the present invention.

The Sixth Embodiment

The sixth embodiment of the present invention has disclosed a flat glass of the present invention based on the above first embodiment; the surface of the said flat glass is attached with a layer of polycrystalline silicon sintered by and transferred from noncrystalline silicon.

The Seventh Embodiment

The seventh embodiment of the present invention has disclosed a flat glass of the present invention based on the above first embodiment; the said flat glass contains a resin bed with quartz, $Al_2O_3$ or mullite crystal.

A flat glass of the present invention has novel technical solutions in the field of flat glass: the said glass contains $SiO_2$, CaO, MgO, $Al_2O_3$, $Fe_2O_3$ and $Na_2O$; calculated as per weight percentage, the $B_2O_3$ content of the said flat glass is 0-3.9%, $Na_2O$ 0.01-14%, $Fe_2O_3$ 0.01-5%, 0-2.81% $F_2O$, MgO 8.1-22.2% and $Al_2O_3$ 0.01-39%, wherein the content of $SiO_2$ is 1.9-4.1 times that of CaO, and the content of CaO is 1.2-1.6 times that of MgO; the lower limit of annealing temperature (endothermic peak threshold temperature) of the said flat glass goes between 550° C.-710° C.; the thickness difference of the said flat glass is less than 0.3 mm; the water absorption of the said flat glass goes between 0-0.3%; the flexural strength of the said flat glass is up to 50-180 Mpa.

The technical solutions of the present invention have the following characteristics:

First, for all flat glass in the prior art, it is an invention for selection such compositions as aluminum, silicon, calcium, magnesium, ferrum and sodium as well as the compositions among silicon, calcium and magnesium; it is an invention about the changes of ratios among these technical elements; in the selection of changes over the ratios among the elements of the present invention, its technical solution is as follows: Silicon is 2.0-4.1 or 2.0-3.6 times that of calcium, and calcium 1.2-1.6 or 1.3-1.49 times that of magnesium; all the flat glass in the prior art at least has two end values for the ratio between the two elements mentioned above; beyond the scope of the present invention, that is the selection of the ratios of the above elements of the present invention is in the scope of the prior art, featuring novelty; in the application of flat glass, the following new product properties have been found, and the following unexpected technical effects are generated.

Second, the present invention has disclosed an invention type for the new application of the product transferred from its new properties; it also generates the unexpected effect in the invention (That is, though the processing methods of all kinds of flat glass and in the new applications of flat glass, it can generate the new properties of the flat glass such as coefficient of linear thermal expansion: [1] excellent and new viscosity temperature and products at different process stages, [2] thickness difference, [3] water absorption, [4] flexural strength, [5] visible light transmittance, [6] waviness, [7] lower limit of annealing temperature (endothermic peak threshold temperature), [8] new properties and new applications of flat glass such as coefficient of linear thermal expansion).

In the new applications, the present invention has found the viscosity temperature at melting, homogenization, bubble discharge and clarification process stages, especially the control for waviness evenness, thickness difference and viscosity temperature in stretching process (or the polishing in the float process) at forming process stage, which are never disclosed in the products in the prior art.

(A) One of the discoveries of new product properties: It has overcome the element omission of $Na_2O$ of flat soda glass caused by the conventional technical prejudice; the flat soda glass in the prior art contains about 13% sodium which is mainly used for fluxing, especially the fluxing for silicon to control the viscosity at each process stage; however, the technical solutions and new product properties found in the present invention have broken through this technical prejudice; it can be invented according to the change relations among silicon, calcium and magnesium; in the application of flat glass, the new product properties is 150° C.-250° C. lower than the viscosity temperature at several process stages for high-sodium flat glass in the prior art when the sodium content is 0-1%; this will produce the thickness difference and waviness that can save energy and control the high-quality product; it can overcome such defects as stones and slag points caused by poor melting process as well as bubble ratio caused by poor bubble discharge; especially for the ultrathin flat glass with LCD of 0.5-1.1 mm, it can reduce the slag points, stone ratio, bubble ratio, the ratio of nonconforming thickness difference and the ratio of nonconforming waviness; it can thus form a technical control platform with a larger scope.

In the operation of the prior art and in case of any defects at each process stage, the temperature will be increased for each process stage in operation so as to remove such defects; however, the top of molten pool will be easily collapsed, which greatly shortens its service life; the present invention provides an adjustable scope for the viscosity which is technically controllable in the control process, which has fundamentally solved the technical difficulties that the insiders think that the existing sodium (high-sodium) flat glass is suffering "short-nature material" (namely "short-nature glass).

(B) One of the discoveries of new product properties: In the present invention, 13% sodium in flat glass containing 99% calcium and sodium is changed as 0.01-1%, 0.01-0.1% or scarcely any sodium, which is omitted in the invention; it is found that the technical solutions for the ratio of silicon, calcium and magnesium in the present invention have overcome such a technical prejudice that the annealing temperature can be increased only by adding aluminum or boron in the prior art; it produces the new product properties that the lower limit of annealing temperature can be about 100° C. lower when it contains low aluminum and boron (only 1% below); when it contains low sodium (or less than 1%), the annealing temperature will increase and more product properties will appear (see samples); the lower limit of annealing temperature (endothermic peak threshold temperature) of the said flat glass goes between 610° C.-710° C.; it is preferred to be 610° C.-650° C., or add the content of $Al_2O_3$; more preferential product properties with 650° C.-710° C. are brought about; it is found that the lower limit of annealing temperature (endothermic peak threshold temperature) will be lower as the sodium content increases; now, the lower limit of annealing temperature (endothermic peak threshold temperature) of more than 99% flat glass for building containing 13% sodium is only 490° C.; the lower limit of annealing temperature (endothermic peak threshold temperature) of flat glass without sodium (or only 0.01-1%) and boron in the present invention goes between 610° C.-710° C.; the lowest content of magnesium in the flat glass (the content of aluminum is within 1%) under the technical solution of the present invention is 8.1% (normally more than 12%), and calcium is at least 1.2 times that of magnesium, namely 9.6% (normally more than 15%); this is the major reason for radical increase of the lower limit of annealing temperature (endothermic peak threshold temperature); it is 120° C.-200° C. higher than the common soda-lime flat glass; this is another discovery for new product property.

It should be noted here that the lower limit of annealing temperature (endothermic peak threshold temperature) of the glass can be radically increased without boron by adding the contents of calcium and magnesium to be 19-50% (normally only containing 10-12% calcium and magnesium) which is higher than the soda-lime glass in the prior art, and the content of $Na_2O$ is also increased radically to be 2-13% which is only slightly lower than the lower limit of annealing temperature (endothermic peak threshold temperature) of the product without sodium or low sodium; however, it does not mean that the purpose of production can be achieved by adding more calcium and magnesium, because it must have the process conditions that are suitable for flat glass, especially lower viscosity temperature of bubble discharge; if the flat glass in the prior art is added with more calcium and magnesium contents rather than the ratio of silicon, calcium and magnesium in the present invention; even though the content of calcium and magnesium is added in the prior art, its viscosity temperature is still 150° C.-300° C. higher than the present invention; for example, the alkali-free boron flat glass is added with 8-15% boron as a fluxing agent and only 8-10% $Al_2O_3$ at $10^2$ Pa·s, the temperature for bubble discharge is more than 1,500; an expensive platinum bubble discharge channel of shallow molten pool (the depth of liquid glass: only 5-10 cm) must be used to complete the procedures for bubble discharge; moreover, the daily output is only several tons; therefore, its output is several hundred times less than the technical solutions of the present invention that the viscosity is low, the lower limit of annealing temperature (endothermic peak threshold temperature) is high, and it can produce several hundred tons per day (the depth of molten pool in bubble discharge area: 70-100 cm); what's more, its investment is several times than the present invention; that is to say, to overcome the increase of lower limit of annealing temperature (endothermic peak threshold temperature) to make it meet the requirements of all LCD flat glass, glazed, fireproof and explosion-proof flat glass; the flat glass in the prior art adopts the technical solution by adding 20-50% calcium and magnesium rather than adopting the technical solution of the present invention related to changes over the ratio of all elements and the selection of the present invention; it is not the unexpected combined technical effects which can make the cost and the lower limit of annealing temperature (endothermic peak threshold temperature) compatible each other.

Its unexpected technical effects do not lie in the lower limit of annealing temperature (endothermic peak threshold temperature) of the product of the present invention containing no sodium and boron or containing low aluminum as well as the coefficient of linear expansion at 150° C.-300° C.,610° C.-650° C. or 680° C.; it can fully produce high-quality, low cost and dozens of times of production efficiency, meet the technical requirements of producing TFT liquid crystal glass and form better economic cost goal; it can also be used in the substrate of common PDP display, reach such a goal that the lower limit of annealing temperature (endothermic peak threshold temperature) is higher than 580° C. to make the deformation in the sintering process at about 580° C. suffer small change; moreover, if more $Al_2O_3$ is added, the temperature will be higher and reach the standard that the lower limit of annealing temperature (endothermic peak threshold temperature) of liquid crystal glass is higher than 650° C.-710° C. to the deformation of glass substrate when the transistor film is sintered at about 600° C.-650° C. and reach within 3 PPM.; this is greatly better than the existing PDP substrate glass and alkali-free boron glass; moreover, the existing middle-end LCD can improve the technical levels, which is good for the upgrade of LCD and greatly improves the pixel precision of resolution(All LCD glass in the prior art adopts the flat glass with 13% sodium at only 490° C. for the lower limit of annealing temperature (endothermic peak threshold temperature)); another technical effect is that the viscosity temperature is lower than 200° C. for existing soda glassit can make LCD, PDP ad TFT glass develop to be as thin as 0.1-0 3 mm and feature high standard thickness difference and waviness, which takes the lead in the industry.

(C) One of the discoveries of new product properties: It has overcome the conventional technical prejudice; it produces an invention of omitting a technical element related to "$B_2O_3$" of an alkali-free boron glass of the flat glass; the existing alkali-free boron flat glass especially used for LCD cannot contain more than 1% sodium. ($Na_2O$ will gradually erode the extremely fine circuits attached on the transistor film of the glass); therefore, 8-15% boron is used as a fluxing agent; a technical prejudice exists among some believing in this way; in particular, its fluxing for silicon can achieve the reduction of viscosity temperature of the high-quality flat glass at each process stage; however, the technical solution and the new properties found in the present invention have broken through such technical prejudice; due to the change over the ratio of silicon, calcium and magnesium and in the application of flat glass, the new product properties can be 250° C.-350° C. lower than the viscosity temperature of the product with 8-15% boron in the prior art at several process stages of the flat glass when there is no $B_2O_3$ (0-1%); this will form a new technical platform for controlling product quality by control process in a bigger scope; for the glass used for LCD, it has high quality requirements such as high-level thickness difference, waviness standard, almost no bubbles, slag points or stones, the finished product rate and excellent product rate related to ultrathin products with 0.5-0 7 mm thickness; for viscosity at bubble discharge, clarification and homogenization process stages and forming and stretching process stages; it has provided a process control scope and a process control platform which is much better than the prior art.

(D) One of the discoveries of new product properties: It has overcome a technical prejudice that the viscosity temperature of the conventional flat glass will be naturally increased radically by adding $Al_2O_3$; for example, the existing soda-lime glass can only be added with about 1% $Al_2O_3$ while the existing alkali-free boron flat glass can also be added with about 8% $Al_2O_3$ to improve strain points; if it is added too much, it will make the viscosity temperature which have been very high at each process stage much higher and fail to achieve the quality goal by controlling the process; some believe that the product strength can be improved by adding 25-30% $Al_2O_3$ when the controllable process cannot reduce the cost; however, the technical solutions and the new product properties of the flat glass found the present invention have broken through such a technical prejudice; when the present invention does not contain boron, sodium and fluorine (0-1%), and the content of $Al_2O_3$ is about 3.1%, 16%, 20% or 25% which is a great change, the prior art holds that the viscosity will be increased radically, but the change of the viscosity temperature in the present invention only goes between 20° C.-40° C.; when the content of $Al_2O_3$ changes between 1-30%, the viscosity temperature only increases about 40° C.-80° C. (See 11 samples of Table 1 and the sample contrast of Table 2).

Moreover, the viscosity temperature is 100° C.-200° C. lower than the flat glass which features high annealing point, environmental protection, energy saving, emission reduction, high strength, high evenness and low viscosity whose $Na_2O$ is 13% or $B_2O_3$ is 8-15%; this proves that the technical solutions for the change over the ratio of silicon, calcium and magnesium in the technical solutions of the present invention can produce a new product property when the content of $Al_2O_3$ is 25% or 30%; this is a new property for eutectic composition consisting of aluminum, silicon, magnesium and calcium and containing a high content of $Al_2O_3$; it can produce the unexpected effects in high aluminum content but low viscosity temperature, and then an unexpected technical effect in high-quality and high strength can be produced. In the present invention, the content of $Al_2O_3$ can be up to 19-28%, and the strength can be about 140-160 MPa or 180 MPa which is much higher that 2-3 times of strength of the flat glass which features high annealing point, environmental protection, energy saving, emission reduction, high strength, high evenness and low viscosity made with the prior art; the viscosity temperature is 150° C.-250° C. lower than that with the prior art when the content of $Al_2O_3$ is only 1-25%; therefore, if the viscosity of alkali-free high-boron glass is formed by the technical solution of the present invention, then there will be much room for melting viscosity and strength when the content of $Al_2O_3$ is raised to be 29-39%, (The flexural strength of the glass in the embodiment f the present specification and invention is cut into pieces with a dimension of 50 mm×50 mm×5 mm and measured in accordance with GB/T3810.4-2006.) $B_2O_3$ in the alkali-free high-boron glass made with the prior art volatilizes, which will result in uneven compositions, damage the net structure related to $Al_2O_3$ and thus greatly impact the due strength; this is the important reason why the strength of the alkali-free high-boron glass is relatively poor even though it contains 7-15% $Al_2O_3$.

Therefore, when there are high aluminum content and no boron content, the present invention can produce a flexural strength with 90-145 MPa or 145-180 MPa because it has the new property of eutectoid consisting of silicon, calcium and magnesium with high aluminum content; it also features energy saving, lower cost and large process scope for viscosity temperature; it can control melting at viscosity temperature stage of melting process, overcome the stones, prevent the slag points that are not melted and control the thickness difference and waviness of the flat glass which features high annealing point, environmental protection, energy saving, emission reduction, high strength, high evenness and low viscosity during clarification and forming control(As the viscosity is lower, the flat glass which features high annealing point, environmental protection, energy saving, emission reduction, high strength, high evenness and low viscosity product at this process stage will be softer and have a controllable scope; in contrast, the viscosity is higher, the flat glass which features high annealing point, environmental protection, energy saving, emission reduction, high strength, high evenness and low viscosity product at this process stage will be harder, and then the thickness difference and waviness will not be easily controlled at such process stages as pulling, horizontal drawing, calendaring, leveling in float process, stretching and polishing etc).

(E) To add 0.01-4% $Fe_2O_3$ is a combined invention and can form the new function, save the quality resources and greatly reduce the cost.

Third, since the revealing and discovery of the above new product properties have overcome many of the above prior art prejudices, it produces several unexpected effects as below in terms of flat glass which features high annealing point, environmental protection, energy saving, emission reduction, high strength, high evenness and low viscosity used for building, TFT display, industry, decoration and waterproofing: (1) technical effects in melting quality, bubble quality, smoothness, thickness difference and waviness quality related to the improvement and control process due to the property of viscosity temperature; (2) unexpected energy saving effect with over 200° C. due to the reduction of viscosity temperature; (3) unexpected technical effect in producing 2-3 times increase of strength due to massive addition of aluminum to the property of eutectoid (from 1% to 25% or above); (4) unexpected technical effect in producing 2-3 times thinner flat glass which features high annealing point, environmental protection, energy saving, emission reduction, high strength, high evenness and low viscosity which is 2-3 times energy, resource and warehousing saving due to the increase of strength; (5) The new technical effect of the present invention lies in that it can save the increasingly reduced UD glass raw material resources due to the addition of $Fe_2O_3$ to the nontransparent or low transparent decorative flat glass which features high annealing point, environmental protection, energy saving, emission reduction, high strength, high evenness and low viscosity; the cost of main raw material of glass is reduced by 10 times; the conventional technology holds that the raw material with relatively high ferrum content makes the glass produce the blue-green defects, but the present invention can make the flat glass which features high annealing point, environmental protection, energy saving, emission reduction, high strength, high evenness and low viscosity increase its strength by 2-3 times; therefore, it can be thinned by 2-3 times; light transmittance will be increased while the blue-green level is not significant; it does not affect the use of glass; therefore, this combined discovery can produce a flat glass which features high annealing point, environmental protection, energy saving, emission reduction, high strength, high evenness and low viscosity with comprehensive effect in generating unexpectedly light, thin, high-strength, saving hi-end glass resource and raw material cost; this is a technical effect that other prior art fail to achieve in generation high strength, light weight, thinness, raw material resource saving, and saving the raw material cost by 10 times; (6) Since an invention with a technical element omitted is adopted, it omitted boron to ensure better property for flat process at melting, bubble discharge, forming and stretching stages and generate the property of flexural strength by adding more $Al_2O_3$ under the premises that it can better control the quality than the prior art in stones, slag points, bubble rate, smoothness and thickness difference of alkali-free boron glass in the prior art; moreover, the product quality with high-quality bubble rate, smoothness, thickness difference and waviness can be guaranteed without unexpectedly adding 8-15% boron to flat display; it can solve the technical prejudice that TFT display glass production installation can only adopt overflow process and platinum channel process in the prior art; it can even adopt the float process.; under the premise that thickness, smoothness and waviness are guaranteed, it can produce an unexpected effect in improving the production efficiency by 20-40 times, saving investment by 30-50 times and saving the land and plant by 20 times; compared with the prior art for flat glass which features high annealing point, environmental protection, energy saving, emission reduction, high strength, high evenness and low viscosity, the technical solutions of the present invention has the new, unrevealed and undisclosed properties which are not predicted, forecasted and reasoned in advance; it can overcome the conventionally technical prejudice in flat glass which features high annealing point, environmental protection, energy saving, emission reduction, high strength, high evenness and low viscosity technology and solve the above major issues concerned by people in industry; the technical effect generates the changes over "quality" and "quantity"; it proves that the technical solutions are not obvious but outstanding, having the technical progress and innovativeness. The above is a description on the compositions, properties, manufacturing process, applications and technical effects for the glass of the present invention by specific embodiments; the following is a summary for the characteristics of a flat glass which features high annealing point, environmental protection, energy saving, emission reduction, high strength, high evenness and low viscosity in the embodiment of the present invention; that is, the basic differences between the present invention and the prior art:

The first difference between the present invention and the prior art:

Compared with the existing alkali-free high-boron glass in TFT LCD, there are several hundred patents, other literatures and several thousand embodiments in the world; its representative patent with publication number US2002/0011080A1 titled alkali-free glass of LCD; the biggest differences between its technical solutions and the present invention firstly lie in that: (1) In its technical solutions, $SiO_2$ is 40-70%, CaO is 0-15%, MgO is 0-10% and $B_2O_3$ is 5-20%; it is an invention selection in the ratio of silicon, calcium and magnesium; in the present invention, calcium is 1.2-1.6 times that of magnesium; in the upper limit of the prior art, calcium is 0-10 times that of magnesium; that is, it is less than 0.1 times; its lower limit is 15:0; that is, it is more than 15 times; therefore, the present invention preferentially selects a value in its scope, showing its novelty; moreover, in the prior art, the content of $B_2O_3$ is 5-20%, containing no $Na_2O$ and $Fe_2O_3$; in the technical solutions of the present invention, the content of $B_2O_3$ is 0-3.9%, $Fe_2O_3$ 0.01-5%, and $Na_2O$ 0.01-8.8%; due to its different technical solutions, the change invention in the ratio of silicon, calcium and magnesium in the present invention generates the new product properties; comparatively in viscosity, all alkali-free boron glass in this type is 200° C.-400° C. higher than the viscosity temperature for clarification, homogenization and bubble discharge without adding boron but with adding 10-30% $Al_2O_3$ at $10^{0.5}$ Pa·s, $10^1$ Pa·s and $10^2$ Pa·s and the viscosity temperature for forming, stretching and polishing at $10^3$ Pa·s; the insiders obviously know that the low viscosity temperature of the present invention is very good for the control of slag points and stones at the melting process stage of flat glass which features high annealing point, environmental protection, energy saving, emission reduction, high strength, high evenness and low viscosity, is easy for sufficient melting and good for the control of bubble rate at bubble discharge and clarification process stages (However, all the existing alkali-free boron glass adopts the bubble discharge process for platinum channel installation which has high-temperature viscosity and high cost; the low viscosity of the present invention is surely good for the forming of flat glass which features high annealing point, environmental protection, energy saving, emission reduction, high strength, high evenness and low viscosity, especially the quality control of smoothness, thickness difference and waviness of ultrathin formed TFT glass; (2) All the existing TFT LCD alkali-free boron glass is produced with overflow process, Since it will seriously erode the molten pool, several hundred production lines in the world must conduct cold repair once every year (about three months); such cold repair will cost 100 million yuan or above each time; in the present invention, no boron can be used, so it can overcome this major difficulty; (3) in the present invention, the production can be continued for 8-10 years without cold repair; three month each year for no cold repair are available, which helps improve the production output; (4) in the prior art, the content of boron is 5-20%; there will be a lot of boron to volatilize, which produces uneven compositions and harms the smoothness of glass forming; in the present invention, there is no boron, and the product smoothness is very good; (5) currently, the overflow process can only adopt the equipment with an output of 6-10 tons/day; moreover, the cost will be up to 1 billion yuan or above; the use of high-content $B_2O_3$ will seriously erode the molten pool; in theory and practice, it is impossible at all to use float molten pool with big tonnage for production; in the technical solutions of the present invention, boron is not used, so the production is allowed in float molten pool with 150 tons/day or 200 tons/day; it can improve the production output by 20-30 times, and its investment cost is only 1/40 or 1/60 compared with the same production output; this can greatly save the investment and cost of depreciation (one production line is only 300-500 million yuan); it can save the industrial land by more than 10 times; (6) since LCD glass can be produced without boron, it can fully solve the problem of poison gas discharge from boron during the production of boron glass; (if the content of boron in the product is 10%, then about 20% poison gas from boron will be discharged and volatilize by adding about 30% boron to the raw materials; if it is 10 tons/day by overflow process in the prior art, there will be 2 tons poison gas from boron to be discharged; there will be 20 tons poison gas from boron to be discharged if the production output is 200 tons/day; in the technical solutions of the present invention, the float line with 200 tons/day will not discharge any poison gas from boron; (7) Since 5-20% boron (most of the liquid crystal boron glass in the embodiment is 8-15%) will volatilize greatly, which results in uneven compositions. When containing the same $Al_2O_3$ content, the strength of all high-boron LCD glass will reduce by more than 80% while the present invention does not have boron or have very low-content boron; therefore, it has the high strength; though the claims state in the prior art, " . . . CaO is 0-15%, MgO is 0-10%, $SiO_2$ is 40-70%", $SiO_2$ is about 60% in dozens of embodiments, CaO in most embodiments is less than 1-4%: Only two embodiments are 5.5%, one for 6.2%; they are not in the scope that $SiO_2$ is 1.9-4.1 times that of CaO but in the scope of 10-60 times; MgO in most embodiments is less than 4-5%, which is not in the scope that MgO in the present invention is 8.1-22.2%; according to the convention of "separate comparison principle", this inventor gains the above conclusion by comparing several hundred display patents or claims and embodiments of the literatures at home and aboard; therefore, the present invention is novel; the claims, specification and embodiments in the prior art do not reveal the invention content related to the ratio of silicon, calcium and magnesium, the structural property of new fluxing and eutectic melting compositions and the technical effects in excellent viscosity, lower limit of annealing temperature (endothermic peak threshold temperature), strength, energy saving, low cost and easy control etc, Especially in viscosity, it has a technical effect that its viscosity temperature is 300° C. lower than all existing LCD glass. In strength, it has a better technical effect by 1-2 time (s); it generates the technical effects unexpected by the insiders; it proves that the above technical effects of the present invention are not obvious but innovative.

Any of the above technical effects has not yet been revealed or publicized during the production of all existing LCD boron glass, which is not obvious; any of the technical effects reflects the innovativeness of the present invention.

The second difference between the present invention and the prior art: The prior art SU581097A1 has disclosed an opacified glass in which $SiO_2$ is 50-63%, CaO is 22-33%, MgO is 13-21%, $Al_2O_3$ is 1-3% and $Na_2O$ is 0.5-2%; calcium is 1.4-1.5 times that of magnesium; totally different from the technical field and applications of the flat glass which features high annealing point, environmental protection, energy saving, emission reduction, high strength, high evenness and low viscosity, it is only a technology of producing opacified glass; its major difference from the present invention lies in that the present invention is a flat glass which features high annealing point, environmental protection, energy saving, emission reduction, high strength, high evenness and low viscosity which is manufactured different processes of various flat glass which features high annealing point, environmental protection, energy saving, emission reduction, high strength, high evenness and low viscosity and shows different characteristics; for example, the thickness difference is ±0.3 mm, waviness is within 20 mm, the undulating range is 0-0.03 mm, and flexural strength is 50-180 MPa, preferentially 0-180 MPa or 145-180 MPa; moreover, the present invention contains $Fe_2O_3$. $Na_2O$ is 2.1-14%; it controls and clarifies the technical process indicators such as viscosity temperature, strength and annealing temperature at each process stage for flat glass which features high annealing point, environmental protection, energy saving, emission reduction, high strength, high evenness and low viscosity when $Al_2O_3$ is 0.01-30%, 3.8-30%, 19-30% or 26-39%; moreover, the present invention is a totally different one based on the application of flat glass which features high annealing point, environmental protection, energy saving, emission reduction, high strength, high evenness and low viscosity, and the processes it adopts is totally different from the processes of a flat glass which features high annealing point, environmental protection, energy saving, emission reduction, high strength, high evenness and low viscosity under this technology such as float process, horizontal drawing process, Glaverbel process, calendaring process or overflow process; it adopts the newly discovered technical effects in high smoothness, high-level thickness difference, waviness and high flexural strength at the process stages of the flat glass which features high annealing point, environmental protection, energy saving, emission reduction, high strength, high evenness and low viscosity; the invention purpose of the above prior art is to manufacture a colored, opacified and non-transparent glass product; it does not fully reveal the new product properties such as viscosity, strength, smoothness, thickness difference and waviness etc; it does not reveal any unexpected technical effects of the present invention; the present invention is a new invention type in patent inventions which is a flat glass which features high annealing point, environmental protection, energy saving, emission reduction, high strength, high evenness and low viscosity with new properties and different applications in building, industry, display and so on and can product unexpected technical effects; it is also a combination between the new product properties that have never been revealed and the existing process and of the prior art for flat glass which features high annealing point, environmental protection, energy saving, emission reduction, high strength, high evenness and low viscosity, which produces unexpected technical effects; for example: Since one of the new product property discoveries has overcome the element omission of $Na_2O$ of flat soda glass caused by the conventional technical prejudice; the flat soda glass in the prior art contains about 13% sodium which is mainly used for fluxing, especially the fluxing for silicon to control the viscosity at each process stage; however, the technical solutions and new product properties found in the present invention have broken through this technical prejudice; it can be invented according to the change relations among silicon, calcium and magnesium; in the application of flat glass which features high annealing point, environmental protection, energy saving, emission reduction, high strength, high evenness and low viscosity, the new product properties is 150° C.-250° C. lower than the viscosity temperature at several process stages for high-sodium flat glass which features high annealing point, environmental protection, energy saving, emission reduction, high strength, high evenness and low viscosity in the prior art when the sodium content is 0-1%; this will produce the thickness difference and waviness that can save energy and control the high-quality product; it can overcome such defects as stones and slag points caused by poor melting process as well as bubble ratio caused by poor bubble discharge; especially for the ultrathin flat glass which features high annealing point, environmental protection, energy saving, emission reduction, high strength, high evenness and low viscosity with LCD of 0.5-1.1 mm, it can reduce the slag points, stone ratio, bubble ratio, the ratio of nonconforming thickness difference and the ratio of nonconforming waviness.

In addition, since the revealing and discovery of the above new product properties have overcome many of the above prior art prejudices, it produces several unexpected effects as below in terms of flat glass which features high annealing point, environmental protection, energy saving, emission reduction, high strength, high evenness and low viscosity used for building, TFT display, industry, decoration and waterproofing: (1) technical effects in melting quality, bubble quality, smoothness, thickness difference and waviness quality related to the improvement and control process due to the property of viscosity temperature; (2) unexpected energy saving effect with over 200° C. due to the reduction of viscosity temperature; (3) unexpected technical effect in producing 2-3 times increase of strength due to massive addition of aluminum to the property of eutectoid (from 1% to 25% or above); (4) unexpected technical effect in producing 2-3 times thinner flat glass which features high annealing point, environmental protection, energy saving, emission reduction, high strength, high evenness and low viscosity which is 2-3 times energy, resource and warehousing saving due to the increase of strength.

The seventh difference between the present invention and the prior art: the present invention provides a photovoltaic solar device which includes solar battery, glass substrate or outer cover plate manufactured with the flat glass which features high annealing point, environmental protection, energy saving, emission reduction, high strength, high evenness and low viscosity as set forth in any of the above embodiments; its differences from the photovoltaic solar device include: First, since the content of $Al_2O_3$ can be added with low cost during massive production (such as adding by 25-30%) as well as the eutectic properties of aluminum, calcium and magnesium, the flat glass which features high annealing point, environmental protection, energy saving, emission reduction, high strength, high evenness and low viscosity of the present invention is adopted to improve the strength by 1-2 time (s) when the equipment is not changed and the cost is not increased; therefore, the solar device production, assembling, installation and its use in severe and complex environment can greatly reduce the damage probability and improve the arrangement and completeness; second, since the glass substrate can be produced to improve the strength by 1-2 time (s), the glass products can be thinned by 1-2 time (s), which is very suitable for the light weight of photovoltaic solar device of the present invention, brings the convenience for installation and transport and reduce the increasing cost; in particular, its application in the wooden roof and external wall of buildings in Europe, America, Australia and Southeast Asia can greatly reduce the weight load of the buildings; its use in wooden house is safe, reliable and practical; it is very good for promoting the application of new energy; third, since the glass can be thinned by 1-2 time (s), it can improve the passage of solar energy and enhance the invention efficiency of solar energy.

The technical solutions of the present invention is also of novelty when being judged by the principle of "separate comparison" for the novelty from the claims of the above patent documents, embodiments or physical products.

The present invention is different from the new technical solutions of the above flat glass which features high annealing point, environmental protection, energy saving, emission reduction, high strength, high evenness and low viscosity of various types and can save energy, protect environment, improve input-output ratio and production efficiency, reduce the cost and viscosity temperature and enhance the strength; these are the technical effects that are not expected and obvious in the industry; by reducing the melting temperature, it can save the energy by 30-40%, reduce the emission of $CO_2$ by 30-40% and enhance the product strength by 2-3 times; it is a combined invention for display with new performance and photovoltaic solar device.

The present invention is innovatively designed by the inventor after years of practical experience and summarization; the present invention and any previous technical solution as stated above are the one consisting of technical element structure and the ratio changes each other; the differences of product characteristics formed from new product properties and innovative methods through the exploration of new application are available (There are 3-5 or 4-5 differences between the claims or embodiments of any prior art and the technical element characteristics of technical solutions of the present invention); therefore, the product and its preparation technique extracted from the claims of the specification are of novelty based on the judging principle of "separate comparison".

As pointed out above in the characteristics that the present invention differ from the prior art, the unexpected technical effects produced from the technical solutions of the present invention have solved the several major technical difficulties in the flat glass which features high annealing point, environmental protection, energy saving, emission reduction, high strength, high evenness and low viscosity and the techniques that are expected to be solved but fail to be solved; such difficulties include: (1) In the production of alkali-free boron glass especially TFT LCD, the productivity efficiency can be enhanced by 20-30 times by adopting float process in the present invention for production, and the ratio of investment and output can be enhanced by dozens of times; (2) the effects of energy saving and emission reduction during production; (3) After the half-plate glass with high strength in the world has become thin and light by ⅓, it can save the raw material by 60%-70%, save energy by 60%-70% and reduce emission by 60%-70%; (4) The discharge of poison gas from boron and cold repair expense are expected to be solved; (5) The product strength is expected to be improved; (6) The smoothness problem is expected to be solved; (7) The energy saving for inland and ocean shipping are expected to be 60%-70%; the carbon emission during shipping is expected to be reduced by 60%-70%; (8) The building glass is used in a lightweight manner; (9) The controllably improved viscosity temperature of flat glass which features high annealing point, environmental protection, energy saving, emission reduction, high strength, high evenness and low viscosity and the improvement of product quality are expected; the contribution to the technical development trends is of great significance.

The technical solutions of the present invention cannot be made by simple logical reasoning or simple test; in particular, the unexpected technical progress effects produced by the technical solutions are not obvious to the insiders; moreover, these technical difficulties are the ones that are researched by thousands of enterprises and hundreds of thousands of technicians in global electronic display material industry and glass industry but have not been solved for nearly 10-20 years; the present invention has solves the major technical difficulties that are expected to be solved in the world flat glass which features high annealing point, environmental protection, energy saving, emission reduction, high strength, high evenness and low viscosity and display industry and solar energy industry as mentioned but fail to be solved as well as dozens of technical difficulties that are mentioned in the specification and expected to be solved but fail to be solved.

The above unexpected technical effects are attributed to a technical solution of the invention that changes the ratio of technical solutions and a flat glass which features high annealing point, environmental protection, energy saving, emission reduction, high strength, high evenness and low viscosity that changes its application; the new product properties have never been revealed or disclosed by the prior art; for example, it has broken through the prior art prejudices related to the eutectoid characteristics such as the viscosity temperature, silicon, calcium and magnesium at each process stage of the flat glass which features high annealing point, environmental protection, energy saving, emission reduction, high strength, high evenness and low viscosity in the technical solution of the present invention, strength, low aluminum or low boron (within 1%), the unimproved annealing temperature, lower limit of high annealing temperature (endothermic peak threshold temperature), low viscosity without boron and high strength characteristics; the technical solutions of the present invention broke through the conventional prejudices for the omission of fluxing elements such as sodium, boron or fluorine in the prior art; the new technical solutions produce the unexpected technical effects; these technical product properties are not predicted and forecasted in advance; the present invention has overcome many technical prejudices, generates the unexpected changes over "quality" and "quantity" whose technical difficulties are expected to be solved but fail to be solved in the above flat glass which features high annealing point, environmental protection, energy saving, emission reduction, high strength, high evenness and low viscosity and display industry and new energy industry; it proves that the technical solutions are not obvious but outstanding, having the technical progress and innovativeness.

The above statement is only for explaining the preferential embodiments in the present invention, but it is not a limitation for the present invention; any technicians who are familiar with this technology may use the above revealed technical contents, amend or modify the equivalent embodiments with the same changes; a flat glass which features high annealing point, environmental protection, energy saving, emission reduction, high strength, high evenness and low viscosity and its preparation method for display and photovoltaic solar device can be implemented according to different requirements and performances; it can be seen that it is still in the scope of technical solutions of the present invention if it is not separated from the content of technical solutions of the present invention, especially the content of claims no matter any simple amendment, equivalent changes and modifications are made for the above embodiments according to the technical essence of the present invention.

What is claimed is:

1. A flat glass which features high annealing point, environmental protection, energy saving, emission reduction, high strength, high eveness and low viscosity, characterized in that:

the said glass contains $SiO_2$, CaO, MgO, $Al_2O_3$, $Fe_2O_3$ and $Na_2O$; calculated as per weight percentage, the said flat glass contains $B_2O_3$ 0-3.9%, $Na_2O$ 0.01-14%, $Fe_2O_3$ 0.01-5%, $F_2O$ 0%, MgO 7-22.2%, and $Al_2O_3$ 4% 39%, wherein the content of $SiO_2$ is 1.9-4.1 times that of CaO, and the content of CaO is 1.0-1.8 times that of MgO;

the lower limit of annealing temperature of the said flat glass goes between 550° C.-710° C.;

the thickness difference of the said flat glass a thickness of with 0.1-20 mm is less than 0.3 mm;

the water absorption of the said flat glass goes between 0-0.3%;

the flexural strength of the said flat glass is up to 50-180 Mpa.

2. The said flat glass as set forth in claim 1, characterized in that the thickness of the said flat glass is 0.1-1.8 mm; calculated as per weight percentage, the said flat glass contains $Na_2O$ 0.01-2%, and $Al_2O_3$ 4% 28% or 29-39%.

3. The said flat glass as set forth in claim 1, characterized in that, the thickness of the said flat glass is 0.1-1.8 mm, calculated as per weight percentage, the said flat glass contains $Na_2O$ 2-14% and $Al_2O_3$ 4% 28% or 29-39%.

4. The said flat glass as set forth in claim 1, characterized in that the thickness of the said flat glass is 1.8-20 mm; calculated as per weight percentage, the said flat glass contains $Na_2O$ 0.01-2%, and $Al_2O_3$ 4% 28% or 29-39%.

5. The said flat glass as set forth in claim 1, characterized in that the thickness of the said flat glass is 1.8-20 mm; calculated as per weight percentage, the said flat glass contains $Na_2O$ 2-14%, and $Al_2O_3$ 4% 28% or 29-39%.

6. A LCD, characterized in that it includes:

an array substrate, which includes a base and a pixel structure on the said base; the said base is a glass plate manufactured with a flat glass, the said flat glass contains $B_2O_3$ 0-3.9%, $Na_2O$ 0.01-14%, $Fe_2O_3$ 0.01-5%, $F_2O$ 0%, MgO 7-22.2%, and $Al_2O_3$ 4% 39%, wherein the content of $SiO_2$ is 1.9-4.1 times that of CaO, and the content of CaO is 1.0-1.8 times that of MgO; the lower limit of annealing temperature of the said flat glass goes between 550° C.-710° C.; the thickness difference of the said flat glass is less than 0.3mm; the water absorption of the said flat glass goes between 0-0.3%; the flexural strength of the said flat glass is up to 50-180 Mpa;

a color filter substrate, which includes a base and a color filter layer on the said base; the said base is a glass plate manufactured with the flat glass;

a liquid crystal layer, which is clamped between the said array substrate and the said base of color filter layer; and a backlight system.

7. The said LCD as set forth in claim 6, characterized in that the thickness of the said flat glass is 0.1-1.8 mm; calculated as per weight percentage, the said flat glass contains $Na_2O$ 0.01-2%, and $Al_2O_3$ 4% 28% or 29-39%.

8. A photovoltaic solar device, characterized in that the said photovoltaic solar device includes solar battery, glass substrate or outer cover plate manufactured with the flat glass contains $B_2O_3$ 0-3.9%, $Na_2O$ 0.01-14%, $Fe_2O_3$ 0.01-5%, $F_2O$ 0%, MgO 7-22.2%, and $Al_2O_3$ 4% 39%, wherein, the content of $SiO_2$ is 1.9-4.1 times that of CaO, and the content of CaO is 1.0-1.8 times that of MgO; the lower limit of annealing temperature of the said flat glass goes between 550° C.-710° C.; the thickness difference of the said flat glass is less than 0.3 mm; the water absorption of the said flat glass goes between 0-0.3%; the flexural strength of the said flat glass is up to 50-180 MPa.

9. The said photovoltaic solar device as set forth in claim 8, characterized in that the thickness of the said flat glass is 0.1-1.8 mm; calculated as per weight percentage, the said flat glass contains $Na_2O$ 0.01-2%, and $Al_2O_3$ 4% 28% or 29-39%.

10. The said photovoltaic solar device as set forth in claim 8, characterized in that the thickness of the said flat glass is 0.1-1.8 mm; calculated as per weight percentage, the said flat glass contains $Na_2O$ 2-14%, and $Al_2O_3$ 4% 28% or 29-39%.

11. The said photovoltaic solar device as set forth in claim 8, characterized in that the thickness of the said flat glass is 1.8-20 mm; calculated as per weight percentage, the said flat glass contains $Na_2O$ 0.01-2%, and $Al_2O_3$ 4% 28% or 29-39%.

12. The said photovoltaic solar device as set forth in claim 8, characterized in that the thickness of the said flat glass is 1.8-20 mm; calculated as per weight percentage, the said flat glass contains $Na_2O$ 2-14% and $Al_2O_3$ 4% 28% or 29-39%.

* * * * *